(12) United States Patent
Ikeda et al.

(10) Patent No.: US 6,471,050 B2
(45) Date of Patent: Oct. 29, 2002

(54) BOARD CONVEYING APPARATUS AND OPERATION PERFORMING SYSTEM

(75) Inventors: Satoru Ikeda, Nagoya (JP); Takeyoshi Isogai, Hekinan (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 73 days.

(21) Appl. No.: 09/728,080

(22) Filed: Dec. 4, 2000

(65) Prior Publication Data

US 2001/0004042 A1 Jun. 21, 2001

(30) Foreign Application Priority Data

Dec. 15, 1999 (JP) .............................. 11-356164

(51) Int. Cl.[7] ..................... B65G 21/00; B65G 21/08; B65G 21/10; B65G 15/12; B65G 15/14
(52) U.S. Cl. ............... 198/861.1; 198/345.1; 198/626.5
(58) Field of Search ............... 198/345.1, 456, 198/626.5, 817, 861.1

(56) References Cited

U.S. PATENT DOCUMENTS

| | | | | |
|---|---|---|---|---|
| 3,325,977 A | * | 6/1967 | Kirsten | .................... 198/626.5 |
| 4,500,243 A | * | 2/1985 | Ward et al. | .................. 271/197 |
| 4,660,280 A | * | 4/1987 | Asai et al. | ................ 198/345.1 |
| 4,729,467 A | | 3/1988 | Vanderlinde | |
| 4,754,867 A | * | 7/1988 | De Anda | .................. 198/464.2 |
| 5,368,643 A | * | 11/1994 | Kuster | ......................... 118/324 |
| 5,749,455 A | * | 5/1998 | Mizuta et al. | ........... 198/626.5 |

FOREIGN PATENT DOCUMENTS

EP    10051191    2/1998

* cited by examiner

Primary Examiner—Christopher P. Ellis
Assistant Examiner—Gene O. Crawford
(74) Attorney, Agent, or Firm—Oliff & Berridge, PLC

(57) ABSTRACT

A printed-board conveying apparatus includes a first belt conveyor and a second belt conveyor. The first belt conveyor includes first stationary and movable guide rails and two first belts. The second belt conveyor is arranged in parallel with the first belt conveyor and includes second stationary and movable guide rails and two second belts. The belts are circulated while being guided by the guide rails. The belts support opposite end positions of a printed board, respectively, and cooperate with each other to convey the printed board.

15 Claims, 5 Drawing Sheets

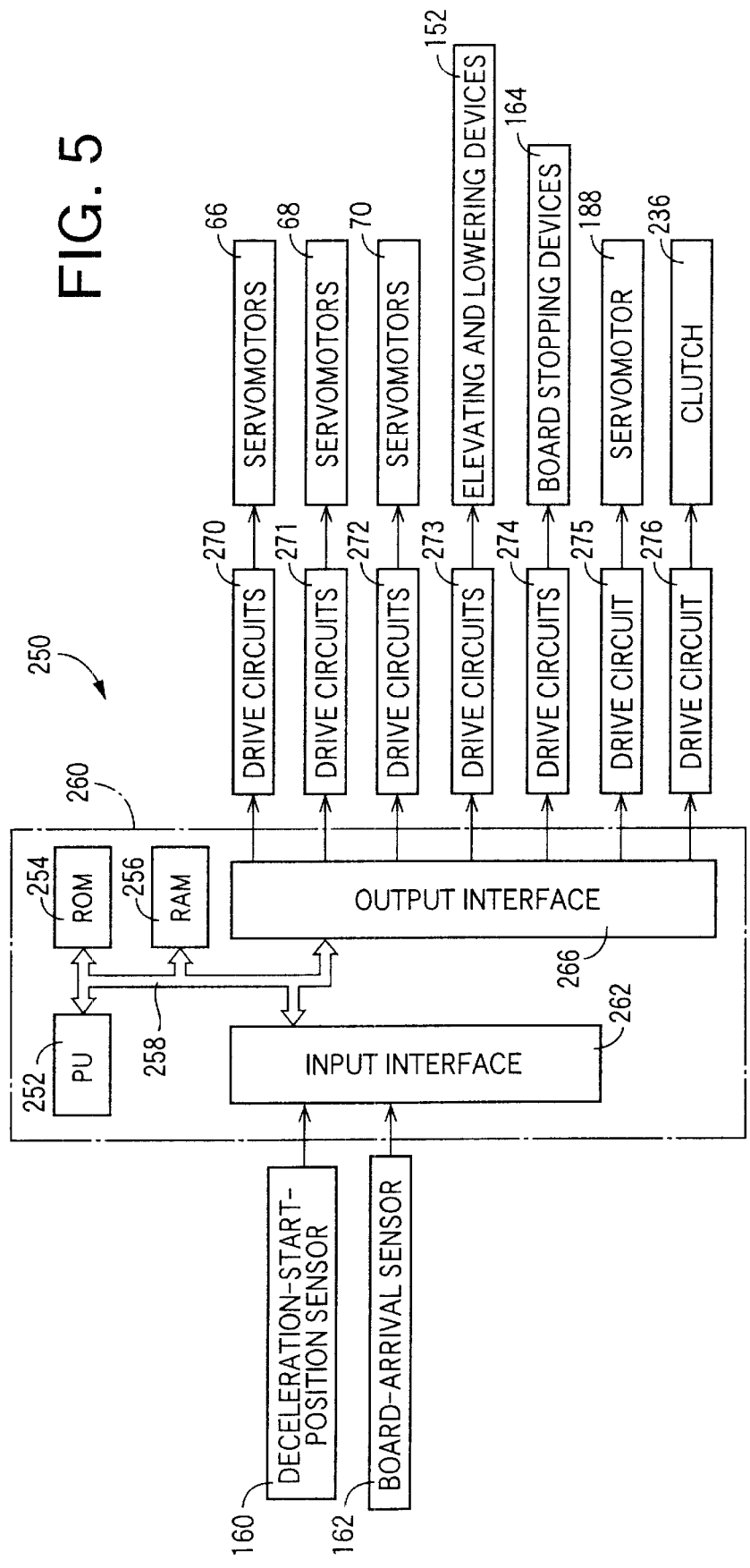

BOARD CONVEYING APPARATUS AND OPERATION PERFORMING SYSTEM

BACKGROUND OF THE INVENTION

1. Field of the Invention

The present invention relates to a printed-board conveying apparatus for. conveying a printed board such as a printed wiring board or a printed circuit board and particularly to such an a printed-board conveying apparatus which includes two belt conveyors which are juxtaposed with each other, i.e., are arranged in parallel with each other.

2. Discussion of Related Art

There is known a printed-board conveying apparatus which is employed by, e.g., an electric-component (EC) mounting system which mounts electric components (ECs) on a printed wiring board and thereby produces a printed circuit board. The EC mounting system includes, in addition to the printed-board conveying apparatus, a supporting device which positions and supports the printed wiring board conveyed by the printed-board conveying device; a supplying device which supplies ECs of different sorts; and a mounting device which receives the ECs from the supplying device and mounts the ECs on the printed wiring board supported by the supporting device. The printed-board conveying apparatus includes two belt conveyors.

In the EC mounting system, the mounting device mounts the ECs on the printed wiring board which has been carried in by the printed-board conveying apparatus and is supported by the supporting device. The printed wiring board on which the mounting of ECs has been completed, i.e., a completed, printed circuit board or a half-completed, printed wiring board is carried out by the conveying apparatus. After the current board is carried out and before the next board is carried in, the mounting device cannot mount any ECs, if the conveying apparatus has a single belt conveyor only. This leads to lowering the efficiency of production of printed circuit boards. Hence, the present conveying apparatus employs two belt conveyors which are arranged in parallel, so that while one of the two conveyors carries in and out printed wiring boards, the mounting device can mount ECs on a printed wiring board which is supported by a supporting device corresponding to the other conveyor. Thus, the present EC mounting system can continuously mount ECs on printed wiring boards, and thereby improve the efficiency of mounting of ECs.

However, in the case where the above-described EC mounting system mounts ECs on printed wiring boards of a large size, the printed-board conveying apparatus needs to employ two belt conveyors each of which has a large width and which are arranged in parallel. This needs to increase the size of the conveying apparatus and accordingly the size of the EC mounting system, which results in needing a large footprint. On the other hand, it is not so often for the EC mounting system to mount ECs on large-size printed boards. Thus, it is not desirable that the EC mounting system increase its own size or need a large footprint. These problems will occur to not only the EC mounting system but also an operation performing system which performs a prescribed operation relating to a printed board, such as an adhesive applying system which applies an adhesive to a printed board so that ECs are adhered to the board with the adhesive, or an inspecting system which inspects a completed, printed circuit board or a half-completed, printed wiring board.

SUMMARY OF THE INVENTION

The present invention provides a printed-board conveying apparatus and an operation performing system which have one or more of the following technical features that are described below in respective paragraphs given parenthesized sequential numbers (1) to (12). Any technical feature that includes another technical feature shall do so by referring, at the beginning, to the parenthesized sequential number given to the latter feature. However, the following technical features and the appropriate combinations thereof are just examples to which the present invention is by no means limited. In addition, in the case where one technical feature recites a plurality of items, it is not essentially required that all of those items be simultaneously employed. That is, it is possible to select and employ only a portion (one, two, . . . , but not all) of those items.

(1) According to a first feature of the present invention, there is provided a printed-board conveying apparatus comprising a first belt conveyor including a first stationary guide rail, a first movable guide rail, and two first belts which are circulated while being guided by the two first guide rails, respectively, and which support opposite end portions of a first printed board, respectively, and cooperate with each other to convey the first printed board; and a second belt conveyor which is arranged in parallel with the first belt conveyor and which includes a second stationary guide rail, a second movable guide rail, and two second belts which are circulated while being guided by the two second guide rails, respectively, and which support opposite end portions of a second printed board, respectively, and cooperate with each other to convey the second printed board, the first stationary and movable guide rails and the second stationary and movable guide rails extending parallel to one another in a first direction, such that the first and second stationary guide rails are provided outside the first and second movable guide rails, respectively, each of the first and second movable guide rails being movable toward, and away from, a corresponding one of the first and second stationary guide rails, so as to change a width of a corresponding one of the first and second belt conveyors, at least one of the first and second movable guide rails being movable, over a middle position between the first and second stationary guide rails, toward one of the first and second stationary guide rails that does not correspond to the one movable guide rail, so as to increase a width of one of the first and second belt conveyors that corresponds to the one movable guide rail.

In the case where the present printed-board conveying apparatus conveys printed boards of a small size, both of the respective widths of the two belt conveyors can be adapted to the small-size printed boards, so that while one of the two conveyors is stopped, the other conveyor can be operated to convey a small-size printed board. Therefore, if the present conveying apparatus is employed in an operation performing system which performs a certain operation relating to a printed board, as described later, one of the two belt conveyors can be stopped so that the operation is performed for the printed board which has been carried in by the one belt conveyor, and the other belt conveyor can be operated so that the printed board for which the operation has been completed is carried out and the next board is carried in. Thus, the present conveying apparatus can improve the operation efficiency of the operation performing system. That is, the present conveying apparatus can convey printed boards of a large size, without needing to be larger in size.

(2) According to a second feature of the present invention that includes the first feature (1), the printed-board conveying apparatus further comprises a first width-changing device which changes the respective widths of the first and second belt conveyors such that the respective widths of the two belt conveyors are equal to each other.

The two belt conveyors may have different widths and alternately convey printed boards of different sorts, respectively. However, in many cases, it is required that the two belt conveyors have a same width and alternately convey printed boards of a same sort. To this end, the first width-changing device is needed. The first width-changing device may include two individual width-changing devices which change the respective widths of the two belt conveyors. However, it is preferred that the first width-changing device include a synchronous width-changing device according to the third feature (3) described below.

(3) According to a third feature of the present invention that includes the second feature (2), the first width changing device comprises a synchronous width-changing device which moves the first and second movable guide rails, in synchronism with each other, such that a distance between the first stationary and movable guide rails and a distance between the second stationary and movable guide rails are kept equal to each other, and thereby changes the respective widths of the first and second belt conveyors, in synchronism with each other.

The synchronous width-changing device may be one which includes two individual width-changing devices which change the respective widths of the two belt conveyors and a control device which operates respective drive sources (e.g., electric motors) of the two individual width-changing devices, in synchronism with each other, or alternatively may be one according to the sixth feature (6) described below.

(4) According to a fourth feature of the present invention that includes any one of the first to third features (1) to (3), the printed-board conveying apparatus further comprises a width-changing device which changes at least one of the respective widths of the first and second belt conveyors such that one of the respective widths of the two belt conveyors is greater than the other of the respective widths of the two belt conveyors.

This width-changing device may be one which include two individual width-changing devices which change the respective widths of the two belt conveyors. However, it is preferred that the width-changing device have the construction according to any one of the fifth to seventh features (6) to (8) described below.

(5) According to a fifth feature of the present invention that includes the third feature (3), the printed-board conveying apparatus further comprises a second width-changing device which changes at least one of the respective widths of the first and second belt conveyors such that one of the respective widths of the two belt conveyors is greater than the other of the respective widths of the two belt conveyors.

(6) According to a sixth feature of the present invention that includes the fifth feature (5), the second width-changing device comprises an asynchronous width-changing device which moves at least one of the first and second movable guide rails, in asynchronism with the other of the first and second movable guide rails.

When the synchronous width-changing device is operated, the respective widths of the two belt conveyors can be changed while the two widths are kept equal to each other. On the other hand, when the asynchronous width-changing device is operated, the width of one of the two belt conveyors can be changed while the width of the other belt conveyor is kept unchanged.

(7) According to a seventh feature of the present invention that includes the sixth feature (6), the synchronous width-changing device comprises two individual width-changing devices which change the respective widths of the first and second belt conveyors; and a connecting and disconnecting device which is selectively placeable in a connecting state thereof in which the connecting and disconnecting device connects the two individual width-changing devices to each other and in a disconnecting state thereof in which the connecting and disconnecting device disconnects the two individual width-changing devices from each other, and which is currently placed in the connecting state, and the asynchronous width-changing device comprises at least one of the two individual width-changing devices and the connecting and disconnecting device which is currently placed in the disconnecting state.

According to this feature, both the synchronous and asynchronous width-changing devices enjoy a simple construction.

(8) According to an eighth feature of the present invention that includes the seventh feature (7), each of the two individual width-changing devices comprises at least two feed screws each of which extends in a second direction perpendicular to the first direction, is rotatable about an axis line thereof, and is not movable in a direction parallel to the axis line; at least two nuts which are fixed to a corresponding one of the first and second movable guide rails; and a rotation transmitting device which includes at least two rotatable members each of which transmits rotation to a corresponding one of the at least two feed screws such that the two feed screws are rotated in synchronism with each other, the connecting and disconnecting device comprises a clutch which is provided between the two rotatable members of one of the two individual width-changing devices and the two rotatable members of the other individual width-changing device and which is selectively placeable in the connecting and disconnecting states, and the asynchronous width-changing device comprises a clutch control device which places the clutch in the disconnecting state.

According to this feature, both the synchronous and asynchronous width-changing devices enjoy a simple construction.

(9) According to a ninth feature of the present invention that includes the seventh or eighth feature (7) or (8), the asynchronous width-changing device comprises an automatic width-change control device which first places the connecting and disconnecting device in the connecting state and operates the synchronous width-changing device to decrease the respective widths of the first and second belt conveyors and, then, places the connecting and disconnecting device in the disconnecting state and operates the one of the two individual width-changing devices to increase the width of a corresponding one of the two belt conveyors.

The synchronous width-changing device may comprise an automatic width-change control device which automatically places the connecting and disconnecting device in the connecting state and operates the two individual width-changing devices to change the respective widths of the first and second belt conveyors. In this case, both the synchronous width-changing device and the asynchronous width-changing device can automatically and easily operate for changing both or one of the widths of the two belt conveyors.

(10) According to a tenth feature of the present invention, there is provided a system for performing a prescribed operation, comprising a printed-board conveying apparatus according to any one of the first to ninth features (1) to (9); a supporting device which positions and supports each of the first and second printed boards conveyed by the printed-board conveying apparatus; and an operation performing device which performs a prescribed operation relating to the each printed board supported by the supporting device.

(11) According to an eleventh feature of the present invention that includes the tenth feature (10), the operation performing system further comprises a supplying device which supplies a plurality of electric components, and the operation performing device comprises a mounting device which receives the electric components from the supplying device and mounts the electric components on the each printed board supported by the supporting device.

(12) According to a twelfth feature of the present invention that includes the eleventh feature (11), the supporting device comprises two individual supporting devices which support the first and second printed boards, respectively, which have been conveyed by the first and second belt conveyors, respectively, and the mounting device comprises at least two mounting heads; and a mounting control device which is selectively operable in a first control mode in which the mounting control device controls the two mounting heads to cooperate with each other to receive the electric components from the supplying device and mount the electric components on each of the first and printed boards which are supported by the two individual supporting devices, respectively, and in a second control mode in which the mounting control device controls the two mounting heads to cooperate with each other to receive the electric components from the supplying device and mount the electric components on one of the first and printed boards which has been conveyed by the one of the first and second belt conveyors that has the increased width and which is supported by one of the two individual supporting devices that corresponds to the one belt conveyor.

BRIEF DESCRIPTION OF THE DRAWINGS

The above and other objects, features, advantages and technical and industrial significance of the present invention will be better understood by reading the following detailed description of preferred embodiments of the invention, when considered in connection with the accompanying drawings, in which:

FIG. 5 is a diagrammatic view of a relevant portion of a control device of the EC mounting system.

DETAILED DESCRIPTION OF PREFERRED EMBODIMENTS

Hereinafter, there will be described an electric-component (EC) mounting system 10 including a printed-board conveying apparatus 14 to which the present invention is applied.

Figure 1:
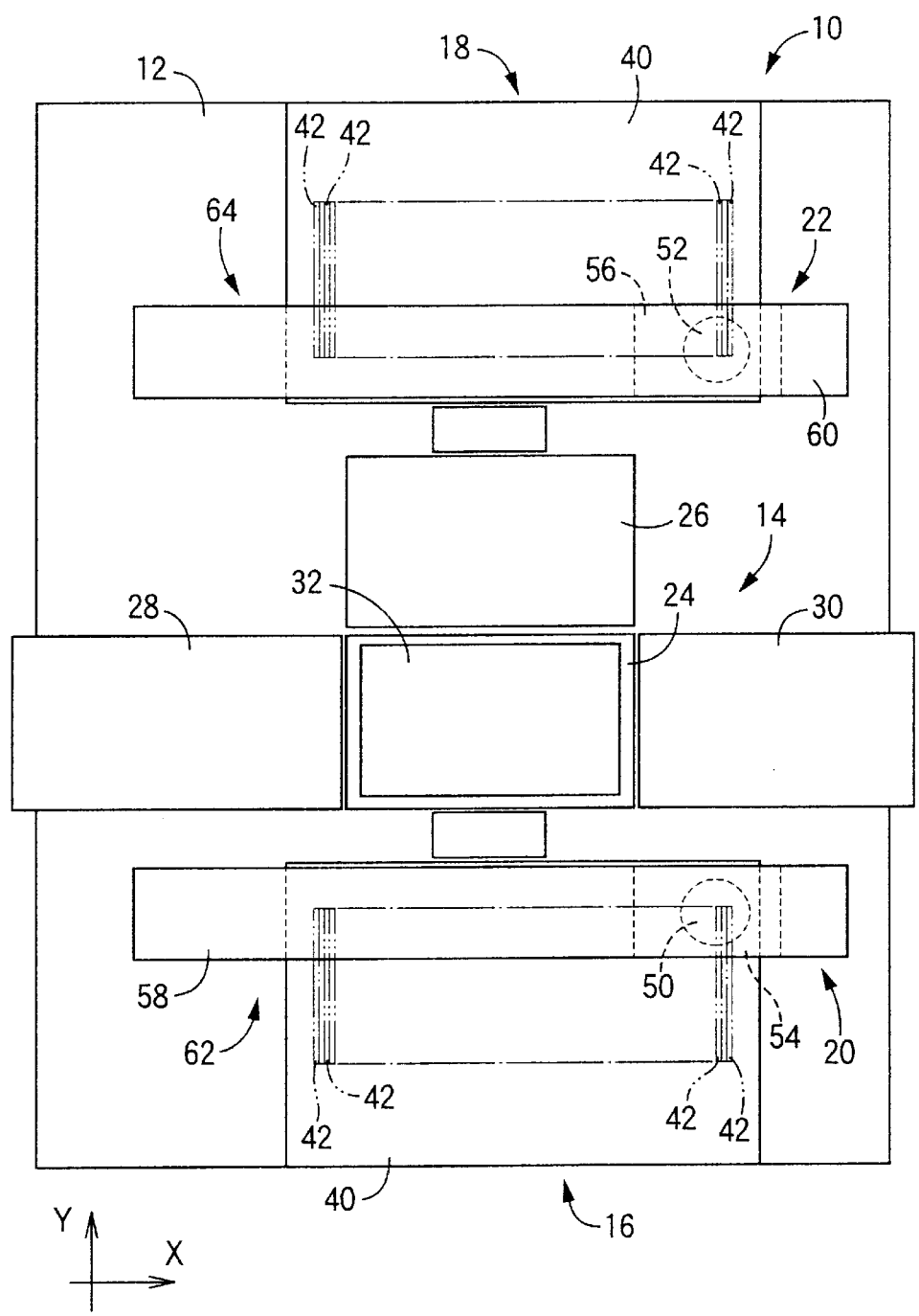
FIG. 1 is a plan view of an electric-component (EC) mounting system including a printed-board conveying apparatus to which the present invention is applied.

The EC mounting system 10, shown in FIG. 1, is part of an electric-circuit assembly line as a sort of operation performing system that includes, in addition to the EC mounting system 10, a screen printing system (not shown) as an upstream-side device that is provided on an upstream side of the EC mounting system 10 in a direction in which a printed wiring board 32 as a sort of printed board is conveyed, and a solder reflowing system (not shown) as a downstream-side device that is provided on a downstream side of the EC mounting system 10. The screen printing system 10 is a sort of solder-paste applying system that applies solder paste to the printed wiring board 32, that is, prints the solder paste on the printed board 32. The EC mounting system 10 mounts electric components (ECs) on the printed board 32. The solder reflowing system reflows or melts the solder paste printed on the printed board 32 and electrically connects the ECs to the board 32.

In FIG. 1, reference numeral 12 designates a base on which the printed-board conveying apparatus 14, two EC supplying devices 16, 18, and two EC mounting devices 20, 22 are provided. The conveying apparatus 14 includes two main conveyors 24, 26, a single carry-in conveyor 28, and a single carry-out conveyor 30. Each of the two main conveyors 24, 26 includes a printed-board positioning and supporting device which positions and supports a printed wiring board 32, and extends in an X-axis direction in which each printed board 32 is conveyed. Hereinafter, the X-axis direction will be referred to as the "board-convey direction". The two main conveyors 24, 26 are juxtaposed with each other in a Y-axis direction perpendicular to the X-axis direction on a horizontal plane. The carry-in conveyor 28 is provided on the upstream-side of the two main conveyors 24, 26 in the board-convey direction, and is shifted by a carry-in-conveyor shifting device (not shown) to a first shift position where the carry-in conveyor 28 is aligned with the first main conveyor 24 and to a second shift position where the carry-in conveyor 28 is aligned with the second main conveyor 26. The carry-in conveyor 28 receives, from the screen printing system, the printed board 32 on which the solder paste has been screen-printed by the printing system, and carries in the board 32 to the first or second main conveyor 24, 26. The two main conveyors 24, 26 will be described in more detail later.

The carry-out device 30 is provided on the downstream side of the main conveyors 24, 26 in the board-convey direction, and is shifted by a carry-out-conveyor shifting device (not shown) to a first shift position where the carry-out conveyor 30 is aligned with the first main conveyor 24 and to a second shift position where the carry-out conveyor 30 is aligned with the second main conveyor 26. The carry-out conveyor 30 receives, from the first or second main conveyor 24, 26, the printed board 32 on which the ECs have been mounted by the EC mounting devices 20, 22, and carries out the board 32 to the solder reflowing system.

The carry-in conveyor 28 and the carry-out conveyor 30 include respective width changing devices (not shown) whose drive sources are operated in synchronism with each other, by a control device 250 (FIG. 5), so that respective widths of the carry-in conveyor 28 and the carry-out conveyor 30 are simultaneously changed to a same width.

Each of the two EC supplying devices 16, 18 includes a plurality of EC feeders 42 each of which is detachably attached to a feeder-support table 40. Each of the EC feeders 42 includes a tape feeding device which feeds a plurality of ECs in the form of an EC carrier tape and supplies the ECs one by one to an EC-supply portion of the each feeder 42. The plurality of EC feeders 42 are attached to the feeder-support table 40 such that the respective EC-supply portions of the EC feeders 42 are arranged along a straight line parallel to the X-axis direction.

The EC mounting devices 20, 22 include respective EC mounting heads 50, 52, and respective X-Y robots 62, 64 which include respective X-axis slides 54, 56 and respective Y-axis slides 58, 60 and which move the respective EC mounting heads 50, 52 to respective arbitrary positions on the horizontal plane. Since the two EC mounting heads 50, 52 have the same construction and the two X-Y robots 62, 64 have the same construction, only the EC mounting head 50 and the X-Y robot 62 will be described blow.

The Y-axis slide 58 of the X-Y robot 62 is provided on the base 12 such that the Y-axis slide 58 is movable in the Y-axis direction, and the X-axis slide 54 of the same 62 is provided on the Y-axis slide 58 such that the X-axis slide 54 is movable in the X-axis direction. The Y-axis slide 58 is moved in the Y-axis direction by a Y-axis-slide moving device including a Y-axis servomotor 66 (FIG. 5) as a drive source and a motion converting device which converts the rotation of the Y-axis servomotor 66 into linear motion and transmits the linear motion to the Y-axis slide 58. Similarly, the X-axis slide 54 is moved in the X-axis direction by an X-axis-slide moving device including an X-axis servomotor 68 (FIG. 5) as a drive source and a motion converting device which converts the rotation of the X-axis servomotor 68 into linear motion and transmits the linear motion to the X-axis slide 54.

The EC mounting head 50 includes an intermittent-rotation (IR) body (not shown) which is attached to the X-axis slide 54 such that the IR body is intermittently rotatable about a vertical axis line thereof. The IR body is rotated by any arbitrary angle in each of opposite directions about the vertical axis line, by a rotating device including a servomotor 70 (FIG. 5) as a drive source. Each of the servomotors 66, 68, 70 is an electric rotary motor as a sort of electric motor and is accurately controllable with respect to its rotation angle and speed. The IR body supports a plurality of EC-suction nozzles each as an EC holder such that the EC-suction nozzles are equiangularly spaced from each other. Each of the EC-suction nozzles is supported by the IR body via a nozzle holder (not shown) such that the each nozzle is movable in axial directions parallel to the vertical axis line of the IR body and is rotatable about an axis line thereof. Each EC-suction nozzle applies a negative pressure to an EC and thereby holds the EC.

Next, there will be described the main conveyors 24, 26.

Figure 2:
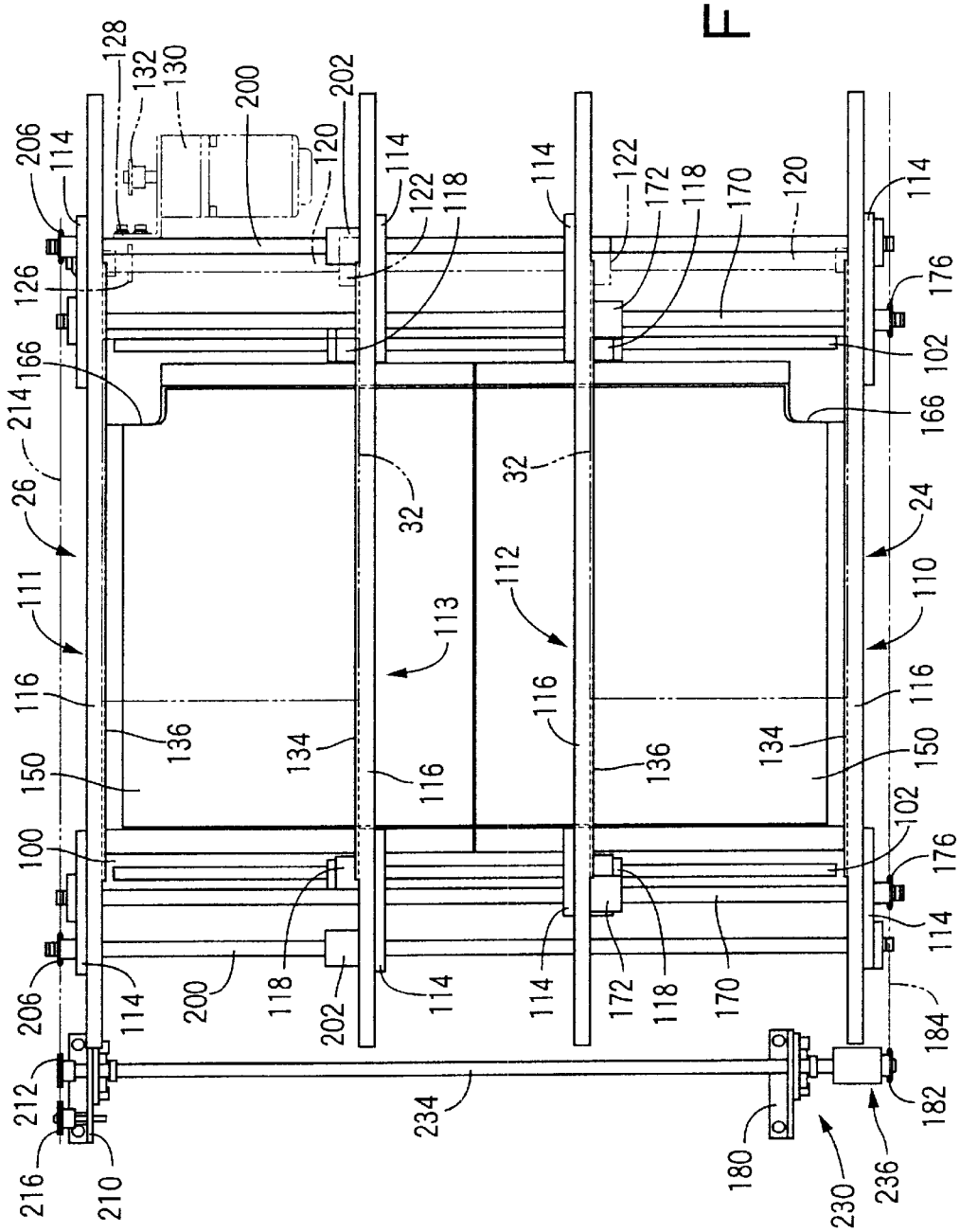
FIG. 2 is a plan view showing a first operation mode of two main conveyors of the printed-board conveying apparatus.
Figure 3:
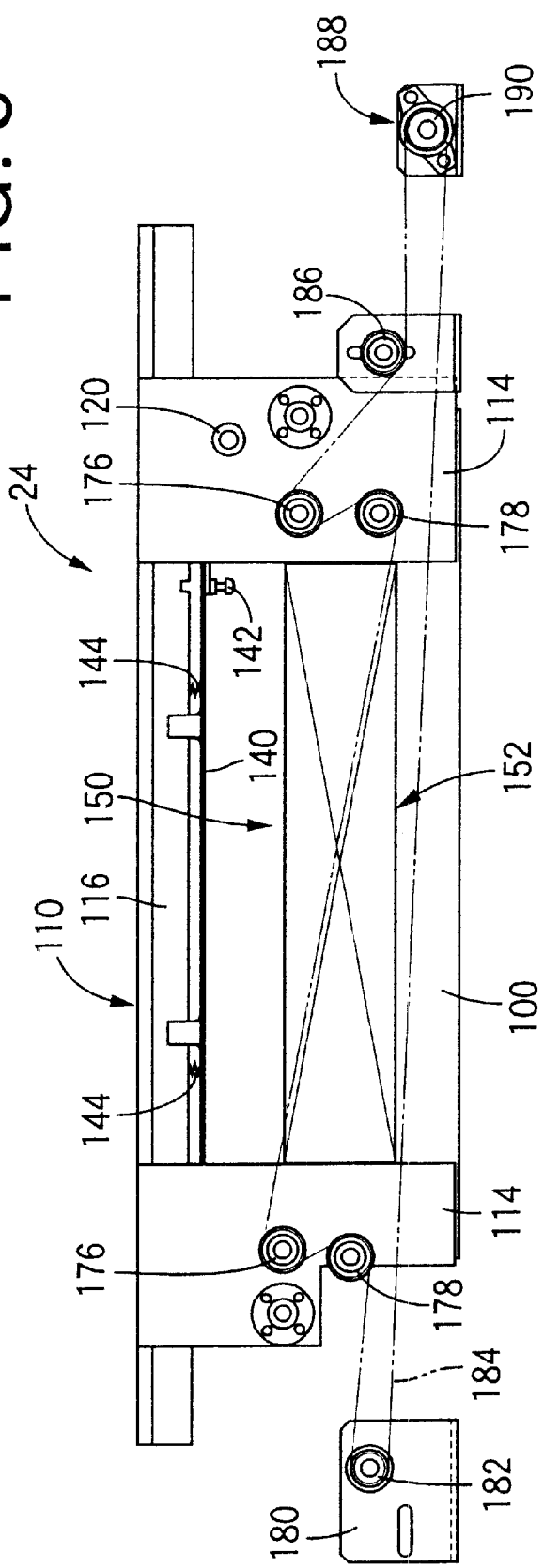
FIG. 3 is a front elevation view of the main conveyors.

As shown in FIGS. 2 and 3, a conveyor-support table 100 as a sort of stationary member is fixed to a portion of the base 12 that is located between the carry-in conveyor 28 and the carry-out conveyor 30 as seen in the board-convey direction. The conveyor-support table 100 has, in the Y-axis direction, a dimension corresponding to the two main conveyors 24, 26. Two straight Y-axis guide rails 102 each as a guide member are fixed to opposite end portions of the conveyor-support table 100 as seen in the X-axis direction, respectively, such that the Y-axis guide rails 102 extend in the Y-axis direction.

The first main conveyor 24 includes a first fixed or stationary guide rail 110 and a first movable guide rail 112, and the second main conveyor 26 includes a second fixed or stationary guide rail 111 and a second movable guide rail 113. The first and second stationary guide rails 110, 111 are provided outside the first and second movable guide rails 112, 113, respectively. The four guide rails 110, 112, 113, 111 are arranged in parallel in this order in the Y-axis direction, and extend parallel to one another in the X-axis direction. As the first stationary guide rail 110 is shown as a representative of the four rails 110-113 in FIG. 3, each of the four rails 110-113 has a gate-like shape including a pair of leg portions 114 and a connecting portion 116 connecting between the two leg portions 114. Each of the two stationary guide rails 110, 111 are fixed to the conveyor-support table 100 via the corresponding leg portions 114. A guide block 118 as a guided member is fixed to each of the leg portions 114 of the two movable guide rails 112, 113, and is fitted on a corresponding one of the two Y-axis guide rails 102 via a ball member (not shown), so that a corresponding one of the two movable guide rails 112, 113 is movable on the two Y-axis guide rails 102 in the Y-axis direction. Thus, the four guide blocks 118, the four ball members, and the two Y-axis guide rails 102 cooperate with one another to provide a linear ball guide as a sort of a guiding device. The distance between the first stationary and movable guide rails 110, 112 defines a width of the first belt conveyor 24, and the distance between the second stationary and movable guide rails 111, 113 defines a width of the second belt conveyor 26. The respective widths of the first and second belt conveyors can be changed by a width changing device which will be described in detail later.

The respective connecting portions 116 of the first stationary and movable guide rails 110, 112 have respective inner surfaces which are opposed to each other in the Y-axis direction, and a plurality of pulleys (not shown) are attached to a plurality of locations of each of the inner surfaces, including opposite end portions of the each inner surface as seen in the X-axis direction, such that each of the pulleys is rotatable about a horizontal axis line thereof. An endless conveyor belt (not shown) is wound on the pulleys attached to the inner surface of the connecting portion 116 of each of the two first guide rails 110, 112. Similarly, the respective connecting portions 116 of the second stationary and movable guide rails 111, 113 have respective inner surfaces which are opposed to each other in the Y-axis direction, and a plurality of pulleys (not shown) are attached to a plurality of locations of each of the inner surfaces, including opposite end portions of the each inner surface as seen in the X-axis direction, such that each of the pulleys is rotatable about a horizontal axis line thereof. An endless conveyor belt (not shown) is wound on the pulleys attached to the inner surface of the connecting portion 116 of each of the two second guide rails 111, 113. A spline shaft 120 is supported the two stationary guide rails 110, 111 and the two movable guide rails 112, 113, such that the spline shaft 120 is rotatable about a horizontal axis line thereof. The two conveyor belts of the first belt conveyor 24 and the two conveyor belts of the second belt conveyor 26 are simultaneously circulated when the spline shaft 120 is rotated about its axis line.

A spline pipe 122 is attached to the first movable guide rail 112 such that the spline pipe 122 is rotatable about an axis line thereof and is not movable in directions parallel to the axis line relative to the guide rail 112. A half portion of the spline shaft 120 that belongs to the first main conveyor 24 is rotatably supported by the first stationary guide rail 110, and is fitted in the spline pipe 122 attached to the first movable guide rail 112, such that the half portion is not rotatable relative to the pipe 122 and is movable relative to the same 122 in directions parallel to the axis line of the shaft 120. Thus, the spline shaft 120 and the spline pipe 122 cooperate with each other to provide a ball spline for the first belt conveyor 24. Two pulleys (not shown) are fixedly provided on the end portion of the spline shaft 120 that is located on the side of the first stationary guide rail 110, and on the spline pipe 122, respectively, and the two conveyor belts of the first belt conveyor 24 are wound on the two pulleys, respectively.

Likewise, the other half portion of the spline shaft 120 that belongs to the second main conveyor 26 is rotatably supported by the second stationary guide rail 111, and is fitted in a spline pipe 122 attached to the second movable guide rail 113, such that the other half portion is not rotatable relative to the pipe 122 and is movable relative to the same 122 in directions parallel to the axis line of the shaft 120. Like the spline pipe 122 for the first main conveyor 24, the spline pipe 122 for the second main conveyor 26 is attached to the second movable guide rail 113 such that the spline pipe 122 is rotatable about an axis line thereof and is not movable in directions parallel to the axis line relative to the guide rail 113. Thus, the spline shaft 120 and the spline pipe 122 cooperate with each other to provide a ball spline for the second belt conveyor 26. Two pulleys (not shown) are fixedly provided on the end portion of the spline shaft 120 that is located on the side of the second stationary guide rail 111, and on the spline pipe 122, respectively, and the two conveyor belts of the second belt conveyor 26 are wound on the two pulleys, respectively. The respective half portions of the spline shaft 120 that belong to the two main conveyors 24, 26 are connected to each other, and are rotated as an integral shaft member. A sprocket 126 is fixed to the end portion of the spline shaft 120 located on the side of the stationary guide rail 111, and is connected via a chain member (not shown) to a sprocket 132 which is fixed to an output shaft of a board-convey motor 130 as a drive source that is attached to a support member 128. The board-conveyor motor 130 is provided by a speed-control motor as a sort of three-phase AC motor as a sort of an electric rotary motor.

When the board-convey motor 130 is started, the respective half portions of the spline shaft 120 that belong to the two main conveyors 24, 26 are rotated as an integral shaft member, so that the corresponding pulleys are rotated and the corresponding conveyor belts are circulated or moved. Thus, two printed wiring boards 32 can be simultaneously conveyed, as needed. The respective circulations or movements of the four conveyor belts are guided by respective belt-guide portions (not shown) of the four guide rails 110–113. In addition, the movement of each of the two printed boards 32 is guided, at respective widthwise opposite ends thereof, by respective vertical guide surfaces of two elongate guide members (not shown) fixed to the corresponding pair of stationary and movable guide rails 110, 112, or 111, 113. Each pair of stationary and movable guide rails 110, 112, or 111, 113 includes respective hold-down portions 134, 136 which project over the respective conveyor belts and prevent the printed board 32 from jumping up off the belts. Between the hold-down portions 134, 136 and the respective upper surfaces of the two conveyor belts, there are left respective spaces each of which has a vertical dimension greater than the thickness of the printed board 32. Therefore, there is left a small space or clearance between the hold-down portions 134, 136 and the upper surface of the printed board 32 placed on the conveyor belts. When each of the respective widths of the main conveyors 24, 26 is changed, the spline pipe 122 attached to a corresponding one of the two movable guide rails 112, 113 is moved relative to the spline shaft 120 in the axial direction thereof, while being kept in spline engagement with the shaft 120. Thus, even if the width of each main conveyor 24, 26 is changed, the rotation of the board-conveyor motor 130 is transmitted to the corresponding pulleys, so that the each main conveyor 24, 26 can convey the printed board 32.

As shown in FIG. 3, a support member 140 is attached to each of the respective inner surfaces of the first stationary and movable guide rails 110, 112 opposed to each other and each of the respective inner surfaces of the second stationary and movable guide rails 111, 113 opposed to each other, such that the support member 140 is movable up and down. Two engagable members 142 (only one member 142 is shown in FIG. 3) project downward from respective lower surfaces of opposite end portions of each of the four support members 140 as seen in the X-axis direction. Each support member 140 is biased downward by a compression coil spring 144 as an elastic member as a sort of biasing device that is provided between the each support member 140 and the connecting portion 116 of the corresponding guide rail 110–113. Therefore, pushing members which are fixed to each support member 140 are held at their retracted position where respective upper-end surfaces of the pushing members are located below a board-conveyor plane along which each printed board 32 is conveyed and which is defined by respective upper surfaces of respective upper horizontal portions of the circulateable conveyor belts and accordingly do not interfere with the movement of the each printed board 32.

On the conveyor-support table 100, there are additionally provided an elevator member 150 and an elevating and lowering device 152 for each of the two main conveyors 24, 26. In FIG. 3, the elevator member 150 and the elevating and lowering device 152 are not illustrated in detail. Since the distance between the two leg portions 114 of each of the two movable guide rails 112, 113 is greater than the X-axis-direction dimension of each elevator member 150, the each elevator member 150 does not interfere with the corresponding movable guide rail 112, 113, when the board-convey width of the corresponding main conveyor 24, 26 is changed. A printed-wiring-board support member as a sort of board support member is provided on each of the two elevator members 150, such that respective positions of the printed-wiring-board support member in the X-axis and Y-axis directions can be adjusted.

When each of the two elevator members 150 is elevated, an upper surface (i.e., a support surface) of the corresponding printed-wiring-board support member supports a lower surface of a printed wiring board 32. The printed-wiring-board support member may be one which applies a negative pressure (i.e., a vacuum) to the printed board 32 and thereby supports the board 32. Each elevator member 150 engages the engageable members 142 of the corresponding main conveyor 24, 26, thereby elevating the corresponding support members 140 and accordingly the corresponding pushing members against the biasing forces of the coil springs 144. Thus, the printed board 32 is pushed up off the conveyor belts. The printed board 32 which is pushed up off the conveyor belts and is supported by the printed-wiring-board support member, is sandwiched by, and between, the hold-down members 134, 146 and the pushing members. Thus, each printed board 32 is fixed to each main conveyor 24, 26, in the state in which an upward or downward warpage of the board 32, if any, is corrected. In the case where the main conveyors 24, 26 convey printed wiring boards of small sizes, the elevator members 150 may not be provided with the above-described printed-wiring-board support members.

Each of the main conveyors 24, 26 includes a deceleration-start-position sensor 160 as a board sensor, a board-arrival sensor 162, and a board stopping device 164 (all are shown in FIG. 5) all of which are provided in a downstream-side half portion of the each conveyor 24, 26 as seen in the board-convey direction. Each of the deceleration-start-position sensor 160 and the board-arrival sensor 162 is provided by a reflection-type photoelectric sensor including a light emitter and a light receiver. The deceleration-startposition sensor 160 detects or identifies that the printed board 32 has reached a predetermined deceleration-start position, by receiving the light reflected from the board 32 at that position; and the board-arrival sensor 162 identifies that the board 32 has reached a predetermined board-arrival-detect position, by receiving the light reflected from the board 32 at that position. Each of the two elevator members 150 has a cutout 166 which assures that the light is incident to the printed board 32. Each of the two sensors 160, 162 may be provided by various other sensors than the above-described reflection-type photoelectric sensor; for example, a transmission-type photoelectric sensor, a proximity switch, or a limit switch.

The board stopping device 164 is provided downstream of the above-described two sensors 160, 162, and includes a stopper member and an elevating and lowering device for elevating and lowering the stopper member (both are not shown). The elevating and lowering device may include, as its drive source, a pressurized-fluid-operated cylinder device such as a pressurized-air-operated cylinder device. The elevating and lowering device elevates the stopper member to its operative position where an upper portion of the stopper member is located above the board-convey plane and stops the movement of the printed board 32, and lowers the stopper member to its inoperative position where the entirety of the stopper member is located below the board-convey plane and allows the printed board 32 to be conveyed over itself.

Respective one end portions of two ball screws 170 each as a feed screw are attached to the two leg portions 114 of the first stationary guide rail 110 of the first main conveyor 24, such that each of the ball screws 170 is rotatable about its axis line and is not movable relative to the guide rail 110 in directions parallel to the axis line. The two ball screws 170 are threadedly engaged with two nuts 172 which are respectively fixed to opposite end portions of the first movable guide rail 112 as seen in the board-convey direction. The respective other end portions of the two ball screws 170 that extend through the movable guide rail 112 are supported by the second stationary guide rail 111 of the second main conveyor 26 such that each of the ball screws 170 is rotatable about its axis line and is not movable relative to the guide rail 111 in the directions parallel to the axis line.

As shown in FIGS. 2 and 3, two sprockets 176 are fixed to the respective end portions of the two ball screws 170 that project outward from the first stationary guide rail 110 of the first main conveyor 24. A chain member 184 is wound on the two sprockets 176, a plurality of sprockets 178 which are rotatably attached to the guide rail 110, and a sprocket 182 which is rotatably supported by a bracket 180. Reference numeral 186 designates a tension sprocket. The chain member 184 is connected to a sprocket 190 which is fixed to an output shaft of a servomotor 188. The servomotor 188 is an electric rotary motor as a sort of drive source, and is accurately controllable with respect to its rotation angle and speed.

Similarly, respective one end portions of two ball screws 200 each as a feed screw are attached to the two leg portions 114 of the second stationary guide rail 111 of the second main conveyor 26, such that each of the ball screws 200 is rotatable about its axis line and is not movable relative to the guide rail 111 in directions parallel to the axis line. The two ball screws 200 are threadedly engaged with two nuts 202 which are respectively fixed to opposite end portions of the second movable guide rail 113 as seen in the board-convey direction. The respective other end portions of the two ball screws 200 that extend through the movable guide rail 113 are supported by the first stationary guide rail 110 of the first main conveyor 24 such that each of the ball screws 200 is rotatable about its axis line and is not movable relative to the guide rail 110 in the directions parallel to the axis line.

As shown in FIG. 2, two sprockets 206 are fixed to the respective end portions of the two ball screws 200 that project outward from the second stationary guide rail 111 of the second main conveyor 26. A chain member 214 is wound on the two sprockets 206, a plurality of sprockets (not shown) which are rotatably attached to the guide rail 111, and a sprocket 212 which is rotatably supported by a bracket 210 via a rotary shaft 234, described later. Reference numeral 216 designates a tension sprocket. The chain member 184 is connected to a sprocket 190 which is fixed to an output shaft of a servomotor 188. The servomotor 188 is an electric rotary motor as a sort of drive source, and is accurately controllable with respect to its rotation angle and speed.

The second chain 214 of the second main conveyor 26 is connected to the first chain 184 of the first main conveyor 24, via a connecting and disconnecting device 230 which includes a rotary shaft 234 and a solenoid-operated clutch 236. The rotary shaft 234 is provided at a position distant from the four guide rails 110-113 in the board-convey direction, extends parallel to the ball screws 170, 200, and is rotatably supported by the brackets 180, 210 fixed to the base 12. The sprocket 212 on which the second chain 214 is wound is fixedly provided on one of the axially opposite end portions of the rotary shaft 234, and the sprocket 182 on which the first chain 184 is wound is fixedly provided on the other end portion of the rotary shaft 234 via the clutch 236. Since the solenoid-operated clutch 236 is well known in the art, it is not described or illustrated in detail. The solenoid clutch 236 may be replaced with a manual clutch which is manually switched to a connecting state and a disconnecting state. Depending upon whether an electric current is supplied to the clutch 236, the clutch 236 is switched to the connecting state in which the rotation of a first clutch member of the clutch 236 that is rotated with the sprocket 182 is transmitted to a second clutch member of the clutch 236 that is rotated with the rotary shaft 234, and to the disconnecting state in which the rotation of the first clutch member is not transmitted to the second clutch member. In the present embodiment, while the electric current is not supplied to the clutch 236, the clutch 236 is switched to the connecting state and, while the electric current is supplied to the clutch 236, the clutch 236 is switched to the disconnecting state. However, it is possible to operate the clutch 236 vice versa. Since the entirety of the clutch 236 is rotated, the electric current is supplied to the clutch 236 via a slip ring.

The connecting and disconnecting states of the solenoid clutch 236 correspond to the connecting and disconnecting states of the connecting and disconnecting device 230, respectively. If, in the connecting state of the device 230, the servomotor 188 is started, the first chain 184 is circulated and simultaneously the second chain 214 is circulated in synchronism with the circulation of the first chain 184, so that the first ball screws 170 and the second ball screws 200 are rotated in synchronism with each other. Thus, the respective movable guide rails 112, 113 of the two main conveyors 24, 26 are moved in synchronism with each other, toward, and away from, the corresponding stationary guide rails 110, 111, while the distance between the first stationary and movable guide rails 110, 112 (i.e., the width of the first main conveyor 24) and the distance between the second stationary and movable guide rails 111, 113 (i.e., the width of the second main conveyor 26) are kept equal to each other.

Thus, the respective board-convey widths of the two main conveyors 24, 26 are simultaneously changed to a same width. Meanwhile, if, in the disconnecting state of the device 230, the circulation of the first chain 184 is not transmitted to the second chain 204, so that only the first ball screws 170 are rotated and only the first movable guide rail 112 of the first main conveyor 24 is moved toward, and away from, the first stationary guide rail 110.

The present EC mounting system 10 includes a control device 250 shown in FIG. 5. The control device 250 is essentially provided by a computer 260 including a processing unit (PU) 252, a read only memory (ROM) 254, a random access memory (RAM) 256, and a bus 258 for coupling those elements 252, 254, 256 to one another. An input interface 262 is connected to the bus 258, and the two deceleration-start-position sensors 160 and the two board-arrival sensors 162 are connected to the input interface 262. In addition, an output interface 266 is connected to the bus 258, and the two servomotors 66, the two servomotors 68, the two servomotors 70, the board-convey motor 130, the two elevating and lowering devices 152, the two board stopping devices 164, the servomotor 188, and the solenoid-operated clutch 236 are connected to the output interface 266 via respective drive circuits 270, 271, 272, 273, 274, 275, 276. The ROM 254 stores various control programs according to which the control device 250 controls the supplying, holding, and mounting of ECs, and the carrying in and out of printed boards 32. The control device 250 additionally controls the carry-in-conveyor shifting device, the carry-out-conveyor shifting device, the carry-in conveyor, the carry-out conveyor, and the respective tape feeding devices of the EC feeders 42.

Next, there will be described the operation of the EC mounting system constructed as described above.

First, there will be described the case where the two main conveyors 24, 26 convey printed boards 32 of a small size.

In this case, the two main conveyors 24, 26 can have a same board-conveyor width corresponding to the width of the small-size printed boards 32. The solenoid-operated clutch 236 is placed, and held, in its connecting state. Therefore, the respective board-convey widths of the two main conveyors 24, 26 can be changed in synchronism with each other such that both of the two widths are kept equal to a same value corresponding to the width of the printed boards 32. In addition, the respective board-convey widths of the carry-in and carry-out devices 28, 30 are changed by the previously-described width changing device to the same width as the widths of the main conveyors 24, 26, in synchronism with the changing of the widths of the same 24, 26. As shown in FIG. 2, the two EC mounting devices 20, 22 alternately mount ECs on a printed board 32 which is currently positioned and supported by one of the two main conveyors 24, 26. More specifically described, the two mounting devices 20, 22 cooperate with each other to mount, on the printed board 32, all the ECs that are pre-programmed to be mounted on the printed board 32 by the present EC mounting system. This is a first control mode in which the two mounting devices 20, 22 are operated. While the ECs are mounted on a first printed board 32 which is currently positioned and supported by one of the two main conveyors 24, 26, the other main conveyor carries out a second printed board 32, carries in a third printed board 32, and positions and supports the third board 32, so that the third board 32 waits on the other main conveyor for mounting of ECs. After the mounting of ECs on the first board 32 supported by the one main conveyor is finished, the first board 32 is carried out by the carry-out conveyor 30, and the mounting of ECs onto the third board 32 is started.

Next, the manner in which each printed board 32 is carried in, positioned, supported, and carried out will be described below. Here it is assumed that mounting of ECs onto a printed board 32 has been started and this EC mounting operation is now in a steady state.

The printed board 32 is conveyed from the screen printing system located upstream of the EC mounting system 10, to the carry-in conveyor 28 of the system 10, in a state in which the carry-in conveyor 28 is positioned at its first shift position. In the case where the carry-in conveyor 28 carries in the printed board 32 to the first main conveyor 24, the carry-in conveyor 28 is not moved, i.e., is kept at the first shift position.

If the previous printed board 32 has been carried out from the first main conveyor 24 to the carry-out conveyor 30 and accordingly it is possible to carry in the current printed board 32 to the first main conveyor 32, the carry-in conveyor 28 carries in the current board 32 to the first main conveyor 24. The control device 250 can judge whether a new printed board 32 can be carried in to the first main conveyor 24, based on whether the corresponding board-arrival sensor 162 is detecting the previous board 32. The sensor 162 supplies a detection or non-detection signal to the control device 250.

When the current printed board 32 is carried in, the board-convey motor for the carry-in conveyor 28 and the board-convey motor 130 for the two main conveyors 24, 26 are started to move the conveyor belts and thereby carry in the current board 32 to the first main conveyor 24. By this time, the board stopping device 164 for the first main conveyor 24 has already been positioned at its operative position. When the deceleration-start-position sensor 160 detects the current board 32 being carried in, the control device 250 controls the board-conveyor motor 130 to decelerate the speed at which the motor 130 moves the conveyor belts or the current board 32; and when the board-arrival sensor 162 detects the current board 32, the control device 250 stops the board-convey motor 130. By this time, the current board 32 has been engaged with, and stopped by, the stopper member being positioned at its operative position. Since the board-convey speed has been decelerated, the current board 32 is stopped with little impact by the stopper member.

After the board-conveyor motor 130 is stopped, the elevator table 150 for the first main conveyor 24 is elevated so that the board-support member of the table 150 supports the lower surface of the current board 32 and the above-described pushing members lift the current board 32 up off the conveyor belts and press the same 32 against the hold-down portions 134, 136. Thus, the current board 32 is positioned by the first main conveyor 24, and then waits for mounting of ECs. Therefore, when the mounting of ECs onto the printed board 32 being positioned and supported by the second main conveyor 26 is finished, one of the two EC mounting devices 20, 22 that has last mounted ECs on that board 32 is moved back to the corresponding one of the two EC supplying devices 16, 18, and concurrently the other EC mounting device is moved to the current board 32 waiting on the first main conveyor 24 and starts mounting ECs on that board 32. Thus, it needs substantially no time to exchange the printed boards 32 with each other, which improves the efficiency of mounting of ECs on printed boards 32.

The board-convey motor 130 is common to the two main conveyors 24, 26 and, when the motor 130 is started, the two main conveyors 24, 26 are simultaneously operated to circulate concurrently the respective pairs of conveyor belts.

Since, however, each printed board 32 is lifted up off the corresponding pair of conveyor belts, for mounting of ECs, as described above, the printed board 32 is not conveyed by the circulation of the pair of conveyor belts. Thus, the present printed-board conveying apparatus 14 can simultaneously perform mounting of ECs on a first printed board 32, carrying in a second printed board 32, and carrying out a third printed board 32, described later.

After the mounting of ECs onto the current printed board 32 supported by the first main conveyor 24 is finished, the current board 32 is released from the sandwiching between the pushing members and the hold-down portions 134, 136. The elevator table 150 is lowered, and the current board 32 is placed again on the pair of conveyor belts. Then, the board-conveyor motor for the carry-out conveyor 30 and the board-convey motor 130 for the two main conveyors 24, 26 are started to carry out the current board 32 to the carry-out conveyor 30. By this time, the carry-out conveyor 30 has been shifted to its first shift position aligned with the first main conveyor 24, and the stopper member of the board stopping device 164 has been moved to its inoperative position. The current board 32 is carried out to the carry-out conveyor 30, and waits on the same 30. If it is possible to transfer the current board 32 to. the solder reflowing system, the carry-out conveyor 30 directly carries out the current board 32 to the reflowing system.

After the carry-in conveyor 28 transfers the current printed board 32 to the first main conveyor 24, the carry-in conveyor 28 receives the next printed board 32 from the screen printing system, and is shifted to the second shift position where the conveyor 28 waits for carrying in the next board 32 to the second main conveyor 26. After the mounting of ECs on the printed board 32 supported by the second main conveyor 26 is finished and that board 32 is carried out, the carry-in conveyor 28 carries in the next board 32 to the second main conveyor 26.

After the carry-out conveyor 30 carries out the current printed board 32 received from the first main conveyor 24, to the solder reflowing system provided on the downstream side thereof, the carry-out conveyor 30 is shifted to the second shift position where the conveyor 30 waits for receiving the next printed board 32 from the second main conveyor 26. After the carry-out conveyor 30 receives the next board 32, the conveyor 30 is shifted to the first shift position where the conveyor 30 carries out the next board 32 to the solder reflowing system.

After the carry-in conveyor 28 carries in the next printed board 32 to the second main conveyor 26, the next board 32 is positioned and supported by the second main conveyor 26, and waits for mounting of ECs, in the same manner as described above for the first main conveyor 24. After the mounting of ECs onto the current printed board 32 being positioned and supported by the first main conveyor 24 is finished, the mounting of ECs onto the next printed board 32 being positioned and supported by the first main conveyor 24 is started. After the mounting of ECs onto the next board 32 is finished, the next board 32 is transferred to the carry-out conveyor 30.

Figure 4:
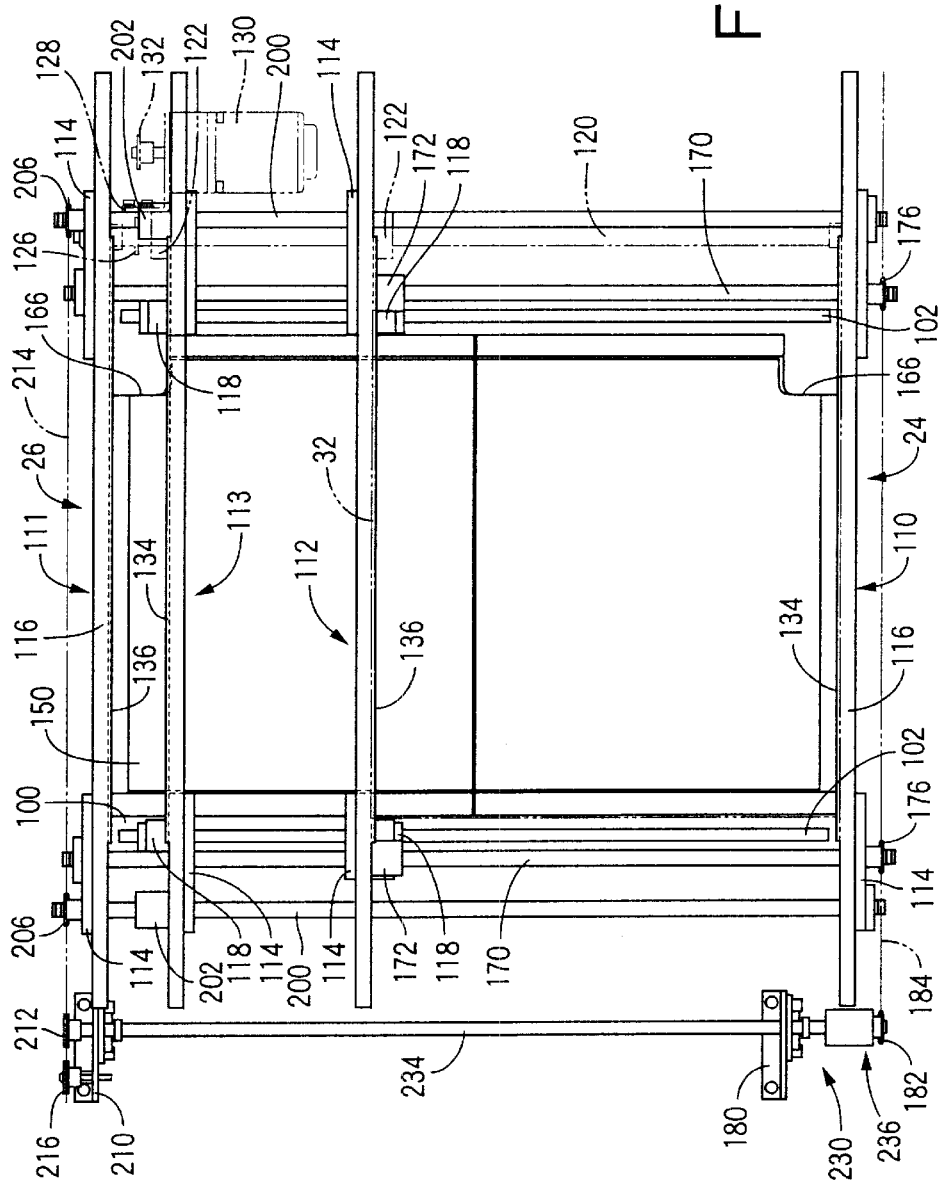
FIG. 4 is a plan view showing a second operation mode of the main conveyors.

Next, there will be described the case where the present EC mounting system 10 mounts ECs on printed wiring boards 32 of a large size, indicated at two-dot chain line in FIG. 4, and the printed-board conveying apparatus 14 conveys, positions and supports each of the large-size printed boards 32. In this case, the respective board-convey widths of the two main conveyors 24, 26 are changed such that the two widths are not equal to each other, that is, the width of the first main conveyor 24 is greater than that of the second main conveyor 26. In the state in which neither of the two main conveyors 24, 26 is supporting a printed board 32 and simultaneously the solenoid-operated clutch 236 is held in its connecting state, the control device 250 controls the servomotor 188 to reduce the respective widths of the two main conveyors 24, 26. More specifically described, the two chain members 184, 214 are circulated and the two pairs of ball screws 170, 200 are rotated, so that the two movable guide rails 112, 113 are moved in synchronism with each other toward the corresponding stationary guide rails 110, 111, while the respective widths of the two main conveyors 24, 26 are kept equal to each other. Subsequently, the control device 250 switches the clutch 236 to its disconnecting state, and thereby switches the connecting and disconnecting device 230 to its disconnecting state in which the rotation of the servomotor 188 is transmitted to only the first stationary movable guide rail 112 of the first main conveyor 24. Then, the first chain member 184 is circulated in the reverse direction opposite to the direction in which the chain member 184 is circulated to reduce the respective widths of the two main conveyors 24, 26, and therefore the first pair of ball screws 170 are rotated in the reverse direction. As a result, the first movable guide rail 112 is moved away from the first stationary guide rail 110, is moved over the middle position between the two stationary guide rails 110, 111 (i.e., the boundary between the respective elevator tables 150 of the two main conveyors 24, 26), and is moved toward the second movable guide rail 113. The respective board-convey widths of the carry-in and carry-out conveyors 28, 30 are simultaneously changed to the same value as that to which the board-convey width of the first main conveyor 24 is changed.

The carry-in conveyor 28 carries in each large-size printed board 32 to the first main conveyor 24 having the thus increased board-convey width. Since the manner in which the printed-board conveying apparatus 14 carries in, positions, supports, and carries out each large-size printed board 32 by using the first main conveyor 24 is the same as the above-described manner in which the conveying apparatus 14 carries in, positions, supports, and carries out each small-size printed board 32 by using the first main conveyor 24, detailed description of the former manner is omitted. However, in the former manner, the two elevator tables 150 are simultaneously elevated to support the lower surface of the large-size printed board 32. Alternatively, depending upon the size of each sort of large-size board 32, it is possible to elevate only the elevator table 150 for the first main conveyor 24. Then the two EC mounting devices 20, 22 cooperate with each other to mount ECs on the large-size printed board 32 being positioned and supported by the first main conveyor 24. This is a second control mode in which the control device 250 controls the two EC mounting devices 20, 22. The control device 250 can selectively control the two mounting devices 20, 22 in either one of the first and second control modes.

It emerges from the foregoing description that in the illustrated embodiment, the printed-board conveying apparatus 14 includes the two main conveyors 24, 26, and that the two elevator tables 150 including the respective printed-board-support members, the two elevating and lowering devices 152, and the two printed-board stopping devices 164 cooperate with the two pairs of guide rails 110, 112, 111, 113 to provide two printed-board supporting devices. The two EC mounting devices 20, 22 cooperate with each other to provide an operation performing device. The sprockets 176, 178, 182, 190 each as a rotatable member and the first chain member 184 cooperate with one another to provide a first rotation transmitting device; and sprockets 206, 212 each as a rotatable member and the second chain member 214 cooperate with one another to provide a second rotation transmitting device. The two balls screws 170, the two nuts 172, and the first rotation transmitting device cooperate with one another to provide a first individual width-changing device; and the two balls screws 200, the two nuts 202, and the second rotation transmitting device cooperate with one another to provide a second individual width-changing device. The two individual width-changing devices and the connecting and disconnecting device 230 which is currently placed in its connecting state, cooperate with each other to provide a same-width width-changing device or a synchronous width-changing device; and the first individual width-changing device and the connecting and disconnecting device 230 which is currently placed in its disconnecting state, cooperate with each other to provide a different-width width-changing device or a asynchronous width-changing device. The control device 250 provides a clutch control device which selectively places the solenoid-operated clutch 236 in either one of the connecting and disconnecting states, or a state switching device which selectively places the connecting and disconnecting device 230 in either one of the connecting and disconnecting states.

In short, the printed-board conveying apparatus 14 is operated as follows: In the case where the conveying apparatus 14 conveys printed boards 32 of a small size, the respective board-convey widths of the two main conveyors 24, 26 are made equal to each other so that ECs are mounted on a first small-size board 32 supported by one of the main conveyors 24, 26 and concurrently a second small-size board 32 is carried in to, and positioned by, the other main conveyor and a third small-size board 32 is carried out from the other main conveyor. This contributes to improving the efficiency of operation of the conveying apparatus 14. Meanwhile, in the case where the conveying apparatus 14 conveys printed boards 32 of a large size, the board-convey width of the first main conveyor 24 is made greater than that of the second main conveyor 26 so that a large-size board 32 is conveyed and positioned by the first main conveyor 24. Thus, the distance between the two stationary guide rails 110, 111 need not be equal to twice the width of the largest-size printed board 32. This contributes to preventing the increase of size of the conveying apparatus 14. In addition, the same-width width-changing device and the different-width width-changing device can be easily switched to and from each other by switching selectively the solenoid-operated clutch 236 to its connecting and disconnecting states. Since the clutch 236 is a simple device, it contributes to simplifying the construction of the conveying apparatus 14. Moreover, since the clutch 236 is automatically switched to its connecting or disconnecting state by the control device 250, the conveying apparatus 10 can be quickly adapted to the small or large size of printed boards 32 to be conveyed thereby. This leads to improving the efficiency of operation of the conveying apparatus 14.

While the present invention has been described in its preferred embodiment, it is to be understood that the present invention may be otherwise embodied.

For example, in the illustrated embodiment, the carry-in conveyor 28, the main conveyor 24, and the carry-out conveyor 30 have the respective exclusive drive sources for the respective width-changing devices thereof. That is, the servomotor 188 as the drive source common to the respective individual width-changing devices for the two main conveyors 24, 26 is independent of the respective exclusive drive sources of the respective width-changing devices for the carry-in and carry-out conveyors 28, 30. The control device 250 can operate the servomotor 188 and the other, two drive sources in synchronism with one another so as to change the respective widths of the three conveyors 24, 28, 30 or the four conveyors 24, 26, 28, 30 in synchronism with one another. However, it is possible to connect, with a common chain member, the three conveyors 24, 28, 30 to each other and employ a common drive source to change the respective widths of the three conveyors 24, 28, 30 or the four conveyors 24, 26, 28, 30 in synchronism with one another.

In addition, in the illustrated embodiment, the servomotors 66, 68, 70, 188 each as an electric rotary motor as a sort of drive source are employed to move the mounting heads 50, 52 and perform the other, various operations. However, it is possible to employ a different sort of electric rotary motors than the servomotors, for example, stepper motors that are accurately controllable with respect to rotation angle. Alternatively, the rotary motors as the drive sources may be replaced with linear motors as a sort of electric motors.

The principle of the present invention is applicable to not only the EC mounting system 10 but also other sorts of operation performing systems such as an adhesive applying system or a circuit-board inspecting system.

It is to be understood that the present invention may be embodied with other changes, modifications, and improvements, such as those described in SUMMARY OF THE INVENTION, which may occur to a person skilled in the art, without departing from the spirit and scope of the invention defined in the appended claims.

What is claimed is:

1. A printed-board conveying apparatus comprising:

a first belt conveyor including a first stationary guide rail, a first movable guide rail, and two first belts which are circulated while being guided by the two first guide rails, respectively, and which support opposite end portions of a first printed board, respectively, and cooperate with each other to convey the first printed board; and a second belt conveyor which is arranged in parallel with the first belt conveyor and which includes a second stationary guide rail, a second movable guide rail, and two second belts which are circulated while being guided by the two second guide rails, respectively, and which support opposite end portions of a second printed board, respectively, and cooperate with each other to convey the second printed board, the first stationary and movable guide rails and the second stationary and movable guide rails extending parallel to one another in a first direction,,such that the first and second stationary guide rails are provided outside the first and second movable guide rails, respectively, each of the first and second movable guide rails being movable toward, and away from, a corresponding one of the first and second stationary guide rails, so as to change a width of a corresponding one of the first and second belt conveyors, at least one of the first and second movable guide rails being movable, over a middle position between the first and second stationary guide rails, toward one of the first and second stationary guide rails that does not correspond to said one movable guide rail, so as to increase a width of one of the first and second belt conveyors that corresponds to said one movable guide rail.

2. An apparatus according to claim 1, further comprising a width-changing device which changes at least one of the respective widths of the first and second belt conveyors such that one of the respective widths of the two belt conveyors is greater than the other of the respective widths of the two belt conveyors.

3. An apparatus according to claim 1, wherein none of the first and second belts supports the other portion of the first printed board than the opposite end portions thereof, and the other portion of the second printed board than the opposite end portions thereof.

4. An apparatus according to claim 1, further comprising a first width-changing device which changes the respective widths of the first and second belt conveyors such that the respective widths of the two belt conveyors are equal to each other.

5. An apparatus according to claim 4, wherein the first width changing device comprises a synchronous width-changing device which moves the first and second movable guide rails, in synchronism with each other, such that a distance between the first stationary and movable guide rails and a distance between the second stationary and movable guide rails are kept equal to each other, and thereby changes the respective widths of the first and second belt conveyors, in synchronism with each other.

6. An apparatus according to claim 5, further comprising a second width-changing device which changes at least one of the respective widths of the first and second belt conveyors such that one of the respective widths of the two belt conveyors is greater than the other of the respective widths of the two belt conveyors.

7. An apparatus according to claim 6, wherein the second width-changing device comprises an asynchronous width-changing device which moves at least one of the first and second movable guide rails, in asynchronism with the other of the first and second movable guide rails.

8. An apparatus according to claim 7, wherein the synchronous width-changing device comprises two individual width-changing devices which change the respective widths of the first and second, belt conveyors; and a connecting and disconnecting device which is selectively placeable in a connecting state thereof in which the connecting and disconnecting device connects the two individual width-changing devices to each other and in a disconnecting state thereof in which the connecting and disconnecting device disconnects the two individual width-changing devices from each other, and which is currently placed in the connecting state, and wherein the asynchronous width-changing device comprises at least one of the two individual width-changing devices and the connecting and disconnecting device which is currently placed in the disconnecting state.

9. An apparatus according to claim 8, wherein each of the two individual width-changing devices comprises at least two feed screws each of which extends in a second direction perpendicular to the first direction, is rotatable about an axis line thereof, and is not movable in a direction parallel to the axis line; at least two nuts which are fixed to a corresponding one of the first and second movable guide rails; and a rotation transmitting device which includes at least two rotatable members each of which transmits rotation to a corresponding one of said at least two feed screws such that the two feed screws are rotated in synchronism with each other, wherein the connecting and disconnecting device comprises a clutch which is provided between the two rotatable members of one of the two individual width-changing devices and the two rotatable members of the other individual width-changing device and which is selectively placeable in the connecting and disconnecting states, and wherein the asynchronous width-changing device comprises a clutch control device which places the clutch in the disconnecting state.

10. An apparatus according to claim 8, wherein the asynchronous width-changing device comprises an automatic width-change control device which first places the connecting and disconnecting device in the connecting state and operates the synchronous width-changing device to decrease the respective widths of the first and second belt conveyors and, then, places the connecting and disconnecting device in the disconnecting state and operates said one of the two individual width-changing devices to increase the width of a corresponding one of the two belt conveyors.

11. A system for performing a prescribed operation, comprising:
a printed-board conveying apparatus comprising:
a first belt conveyor including a first stationary guide rail, a first movable guide rail, and two first belts which are circulated while being guided by the two first guide rails, respectively, and which support opposite end portions of a first printed board, respectively, and cooperate with each other to convey the first printed board, and
a second belt conveyor which is arranged in parallel with the first belt conveyor and which includes a second stationary guide rail, a second movable guide rail, and two second belts which are circulated while being guided by the two second guide rails, respectively, and which support opposite end portions of a second printed board, respectively, and cooperate with each other to convey the second printed board,
the first stationary and movable guide rails and the second stationary and movable guide rails extending parallel to one another in a first direction, such that the first and second stationary guide rails are provided outside the first and second movable guide rails, respectively,
each of the first and second movable guide rails being movable toward, and away from, a corresponding one of the first and second stationary guide rails, so as to change a width of a corresponding one of the first and second belt conveyors, and
at least one of the first and second movable guide rails being movable, over a middle position between the first and second stationary guide rails, toward one of the first and second stationary guide rails that does not correspond to said one movable guide rail, so as to increase a width of one of the first and second belt conveyors that corresponds to said one movable guide rail;
a supporting device which positions and supports each of the first and second printed boards conveyed by the printed-board conveying apparatus; and
an operation performing device which performs a prescribed operation relating to said each printed board supported by the supporting device.

12. A system according to claim 11, further comprising a supplying device which supplies a plurality of electric components, wherein the operation performing device comprises a mounting device which receives the electric components from the supplying device and mounts the electric components on said each printed board supported by the supporting device.

13. A system according to claim 12, wherein the supporting device comprises two individual supporting devices which support the first and second printed boards, respectively, which have been conveyed by the first and second belt conveyors, respectively, and wherein the mounting device comprises:

at least two mounting heads; and a mounting control device which is selectively operable (a) in a first control mode in which the mounting control device controls the two mounting heads to cooperate with each other to receive the electric components from the supplying device and mount the electric components on each of the first and printed boards which are supported by the two individual supporting devices, respectively, and (b) in a second control mode in which the mounting control device controls the two mounting heads to cooperate with each other to receive the electric components from the supplying device and mount the electric components on one of the first and printed boards which has been conveyed by said one of the first and second belt conveyors that has the increased width and which is supported by one of the two individual supporting devices that corresponds to said one belt conveyor.

14. A printed-board conveying apparatus comprising:

a first belt conveyor including a first stationary belt guide rail, a first movable belt guide rail, two first board guide members which are supported by the first stationary and movable belt guide rails, respectively, and two first belts which are circulated while being guided by the first belt guide rails, respectively, and which support opposite end portions of a first printed board, respectively, and cooperate with each other to convey the first printed board while opposite ends of the first printed board are guided by the two first board guide members, respectively; and a second belt conveyor which is arranged in parallel with the first belt conveyor and which includes a second stationary belt guide rail, a second movable belt guide rail, two second board guide members which are supported by the second stationary and movable belt guide rails, respectively, and two second belts which are circulated while being guided by the two second belt guide rails, respectively, and which support opposite end portions of a second printed board, respectively, and cooperate with each other to convey the second printed board while opposite ends of the second printed board are guided by the second board guide members, respectively, the first stationary and movable belt guide rails and the second stationary and movable belt guide rails extending parallel to one another in a first direction, such that the first and second stationary belt guide rails are provided outside the first and second movable belt guide rails, respectively, each one of the first and second movable belt guide rails being movable toward, and away from, a corresponding one of the first and second stationary belt guide rails, so as to change a width of a corresponding one of the first and second belt conveyors, at least one of the first and second movable belt guide rails being movable, over a middle position between the first and second stationary belt guide rails, toward one of the first and second stationary belt guide rails that does not correspond to said one movable belt guide rail, so as to increase a width of one of the first and second belt conveyors that corresponds to said one movable belt guide rail.

15. An apparatus according to claim 14, wherein the first belt conveyor comprises:

a first stationary guide member including a first portion providing the first stationary belt guide rail, and a second portion providing the first stationary board guide member; and a first movable guide member including a first portion providing the first movable belt guide rail, and a second portion providing the first movable board guide member, and wherein the second belt conveyor comprises:

a second stationary guide member including a first portion providing the second stationary belt guide rail, and a second portion providing the second stationary board guide member, and a second movable guide member including a first portion providing the second movable belt guide rail, and a second portion providing the second movable board guide member.

* * * * *